(12) United States Patent
Hsieh et al.

(10) Patent No.: US 8,344,406 B2
(45) Date of Patent: Jan. 1, 2013

(54) LIGHT EMITTING DIODE PACKAGE AND MANUFACTURING METHOD THEREOF

(75) Inventors: Min-Tsun Hsieh, Hsinchu (TW);
Wen-Liang Tseng, Hsinchu (TW);
Lung-Hsin Chen, Hsinchu (TW);
Chih-Yung Lin, Hsinchu (TW);
Ching-Lien Yeh, Hsinchu (TW);
Chi-Wei Liao, Hsinchu (TW);
Jian-Shihn Tsang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 56 days.

(21) Appl. No.: 12/970,976

(22) Filed: Dec. 17, 2010

(65) Prior Publication Data

US 2011/0266570 A1    Nov. 3, 2011

(30) Foreign Application Priority Data

Apr. 28, 2010    (CN) .......................... 2010 1 0158501

(51) Int. Cl.
*H01L 33/00* (2010.01)

(52) U.S. Cl. .................. 257/98; 257/99; 257/E33.066; 257/E33.069

(58) Field of Classification Search .................. 257/98, 257/99, E33.069, E33.066
See application file for complete search history.

(56) References Cited

U.S. PATENT DOCUMENTS

| 6,531,328 | B1 | 3/2003 | Chen | |
|---|---|---|---|---|
| 2002/0047130 | A1* | 4/2002 | Koay et al. | 257/99 |
| 2006/0097621 | A1* | 5/2006 | Park et al. | 313/485 |
| 2008/0174768 | A1* | 7/2008 | Belz | 356/73 |
| 2008/0191233 | A1* | 8/2008 | Yang et al. | 257/98 |
| 2010/0012960 | A1* | 1/2010 | Chang | 257/98 |

* cited by examiner

*Primary Examiner* — Kimberly Rizkallah
*Assistant Examiner* — Timor Karimy
(74) *Attorney, Agent, or Firm* — Altis Law Group, Inc.

(57) ABSTRACT

In a light emitting device package and manufacturing method thereof, a multi-layer structure is allocated upon a substrate, of which at least two films with different refractive indices are alternately stacked together.

13 Claims, 8 Drawing Sheets

LIGHT EMITTING DIODE PACKAGE AND MANUFACTURING METHOD THEREOF

BACKGROUND

1. Technical Field

The disclosure relates generally to semiconductor device technology, and more particularly to a light emitting diode package and manufacturing method thereof.

2. Description of the Related Art

With progress in solid state light emitting device development, light emitting diodes (LEDs) and laser diodes (LDs) are becoming increasingly popular, due to longer lifetimes, lower power consumption, less heat generation, and compact size. Progressively, superior light emitting efficiency of the solid state light emitting devices is required. Accordingly, U.S. Pat. No. 6,531,328 discloses a light emitting device package including a metal reflector on a substrate for enhancing light emitting efficiency. However, the metal reflector may still absorb light emitted from the LED chip, restricting light emitting efficiency. Further, the method for manufacturing the metal reflector is complicated and time-consuming due to numerous plating and etching processes.

What is needed, therefore, is a light emitting diode package which can overcome the described limitations.

DETAILED DESCRIPTION

Exemplary embodiments of the disclosure will now be described with reference to the accompanying drawings.

Figure 1A:
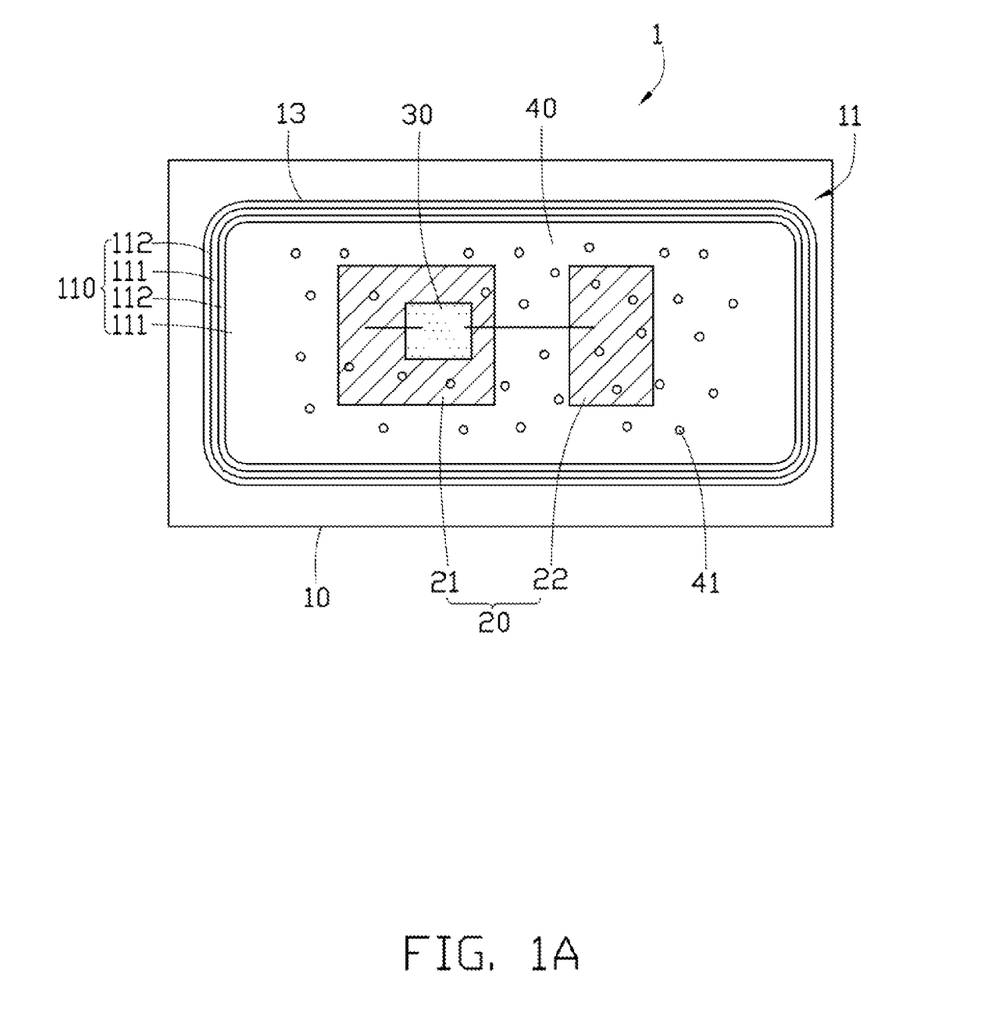
FIG. 1A is a top view of a light emitting diode package in accordance with a first embodiment of the disclosure.
Figure 1B:
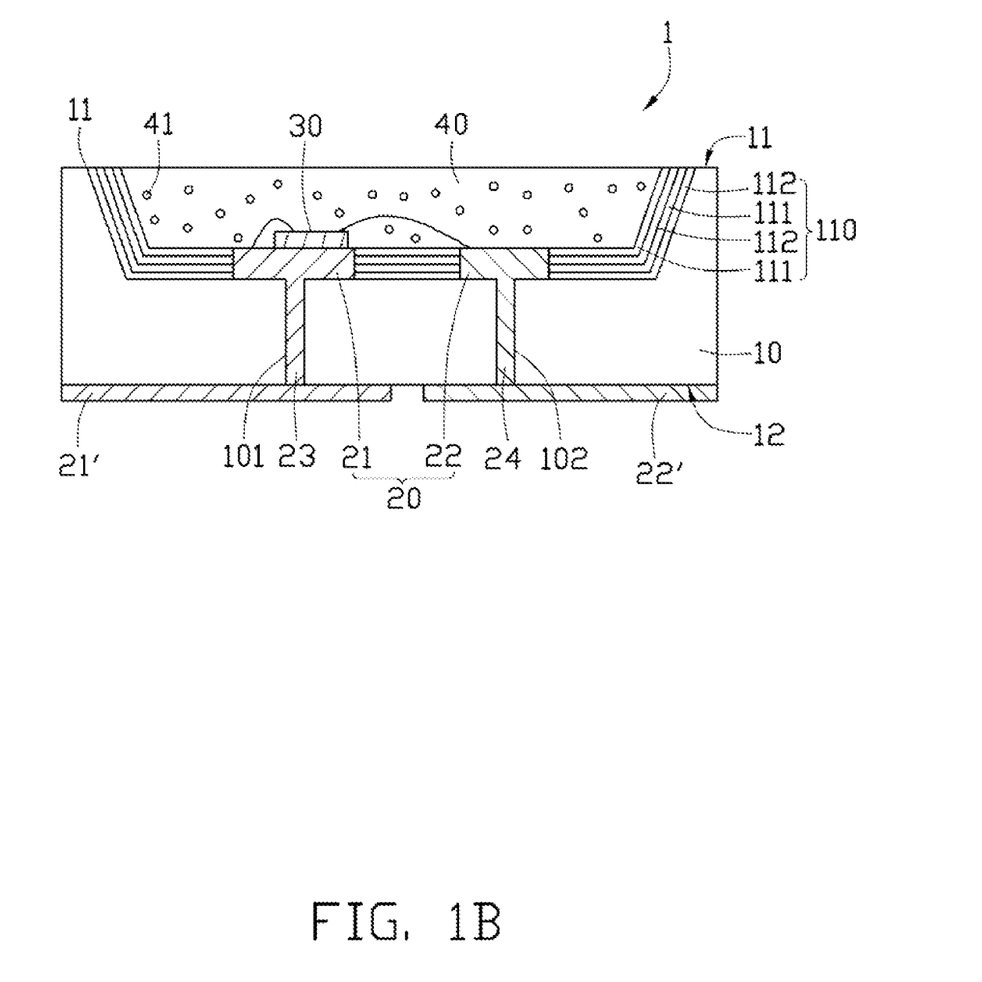
FIG. 1B is a cross section of the light emitting diode package of FIG. 1A.

Referring to FIGS. 1A and 1B, the disclosure provides a first embodiment of a light emitting diode package 1 comprising a substrate 10, a lead frame 20, a light emitting device 30 and an encapsulation 40, wherein the light emitting device 30 is capable of emitting light of a first wavelength.

The substrate 10 comprises a first surface 11 and a second surface 12 opposite to each other. A depression 13 is allocated upon the first surface 11, in which the light emitting device 30 is disposed. In the disclosure, the substrate 10 is silicon, ceramic, metal or polymer, and the depression 13 is formed by wet-etching, dry-etching, mechanic or laser. The depression 13 is configured for collecting light emitted from the light emitting device 30 to a desired direction and accommodating the light field, whereby the light emitting efficiency of the light emitting diode package 1 is enhanced. To further raise the light reflecting efficiency of the depression 13, a multi-layer structure 110 is allocated upon the inner surface of the depression 13, surrounding the light emitting device 30. The multi-layer structure 110 includes a plurality of first films 111 and a plurality of second films 112 alternately stacked, refractive indices of which are different. The thickness of each of the first and the second films 111, 112 is a multiple of about a quarter of the first wavelength. In the disclosure, the multi-layer structure 110 is a distributed Bragg reflector (DBR) and the reflectivity of the multi-layer structure 110, R, is given by:

$$R = \left[\frac{n_0(n_2)^{2N} - n_s(n_1)^{2N}}{n_0(n_2)^{2N} + n_s(n_1)^{2N}}\right]^2$$

wherein $n_0$ is the refractive index of the surrounding medium, $n_1$ and $n_2$ are the respective refractive indices of the first film 111 and the second film 112, $n_s$ is the refractive index of the substrate 10 and the N is the number of repeated pairs of the first film 111 and the second film 112. When the R is approximately given to 1, the reflectivity of the multi-layer structure 110 is optimum. Alternatively, the multi-layer structure 110 can be silicon oxide, titanium oxide, indium tin oxide (ITO), zinc oxide doped with aluminum, aluminum oxide or hybrid thereof formed by oxidation process, nitriding process, E-Gun, sputtering deposition, pulsed laser deposition (PLD) or plasma technology.

The lead frame 20 is allocated upon the first surface 11, and comprises a first electrode 21 and a second electrode 22 electrically disconnected from each other. In the disclosure, the lead frame 20 is also allocated inside the depression 13. Specifically, the lead frame 20 is ITO, copper, nickel, silver, aluminum, tin, gold or alloy, formed by plating process, sputtering, evaporation deposition or electronic beam. The light emitting device 30 is disposed on the lead frame 20 and separately electrically connects to the first and the second electrodes 21, 22 via wire bonding (as shown in FIGS. 1A and 1B), eutectic bonding or flip-chip. For configuring the light emitting diode package 1 to be a surface mounted device (SMD), the first electrode 21 and the second electrode 22 respectively extend from the first surface 11 to the second surface 12 via a first extending electrode 23 and a second extending electrode 24. A third electrode 21' and a fourth electrode 22' are allocated upon the second surface 12 and respectively connected with the first and second extending electrodes 23, 24, whereby electricity from an external circuit (not shown) is able to be conducted into the light emitting device 30 through the first, second, third and fourth electrodes 21, 22, 21', 22' and the first and the second extending electrodes 23, 24. Furthermore, a first hole 101 and a second hole 102 pass through the substrate 10 from the first surface 11 to the second surface 12. Moreover, the first extending electrode 23 fills the first hole 101, and the second extending electrode 24 fills the second hole 102. In the disclosure, the first and the second holes 101,102 are allocated inside the depression 13, or alternatively out of the depression 13 (not shown).

Figure 1C:
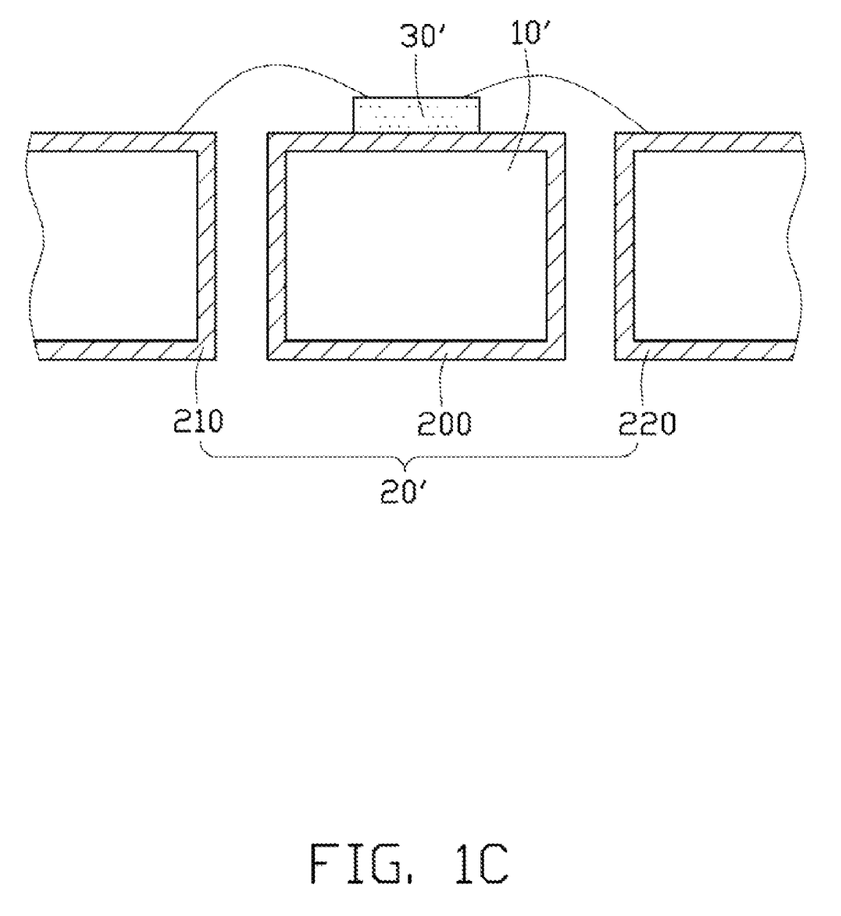
FIG. 1C is a cross section of a modified lead frame of the light emitting diode package of FIGS. 1A and 1B.

In the disclosure, the lead frame 20 is simultaneously used for electric conductivity and dissipating heat generated from the light emitting device 30 to exterior. That is, the thermally conductive pathway and the electrically conductive pathway of the lead frame 20 are integrated. Alternatively, as shown in FIG. 1C, the disclosure also provides a lead frame 20' allocated upon a substrate 10', wherein the lead frame 20' comprises a first electrode 210, a second electrode 220 and a thermal-conductive unit 200 sandwiched between the first electrode 210 and the second electrode 220. The light emitting device 30' is disposed on the thermal-conductive unit 200 and electrically connects to the first electrode 210 and the second electrode 220. Particularity, the thermally conductive pathway and the electrically conductive pathway of the lead frame 20' are independent. The first electrode 210 and the second electrode 220 are used for electrically connecting the light emitting device 30' to the external circuit. The thermal-conductive unit 220 is used for dissipating heat generated from the light emitting device 30' to exterior. Accordingly, the thermally conductive pathway and the electrically conductive pathway do not interfere with each other.

The light emitting device 30 is capable of emitting light of the first wavelength. Specifically, the light emitting device 30 is III-V or II-VI compound semiconductor able to emit visible or invisible light such as that of ultraviolet, blue, green or multiple wavelengths.

Referring to FIGS. 1A and 1B, the encapsulation 40 is allocated upon the first surface 11, and covers the light emitting device 30 and the lead frame 20 to prevent damage from external force. In the disclosure, the encapsulation 40 is silicone, epoxy or any transparent materials. Alternatively, the encapsulation 40 can comprise at least one luminescent conversion element 41 such as YAG, TAG, silicate, nitride, nitrogen oxides, phosphide and sulfide. When the luminescent conversion element 41 is excited by light emitted from the light emitting device 30, converted light is emitted from the luminescent conversion element 41 to mix with other light from the light emitting device 30 to generate white or mixed light.

Figure 2A:
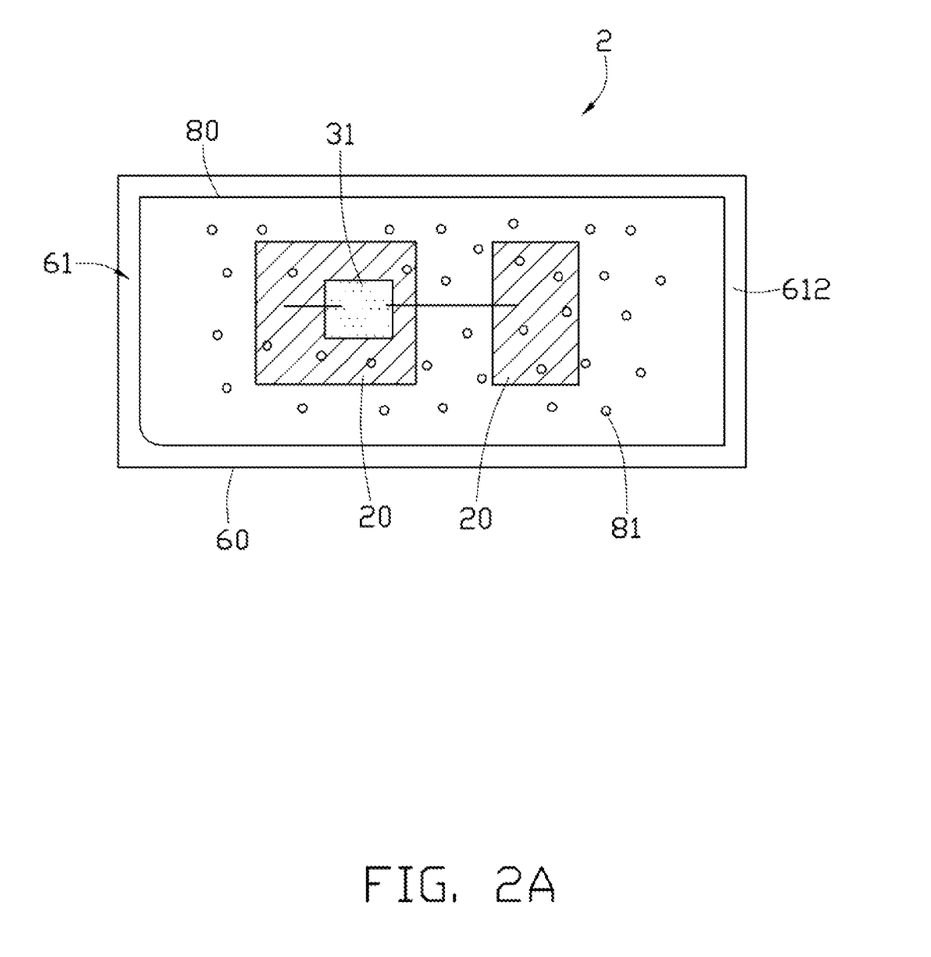
FIG. 2A is a top view of a light emitting diode package in accordance with a second embodiment of the disclosure.
Figure 2B:
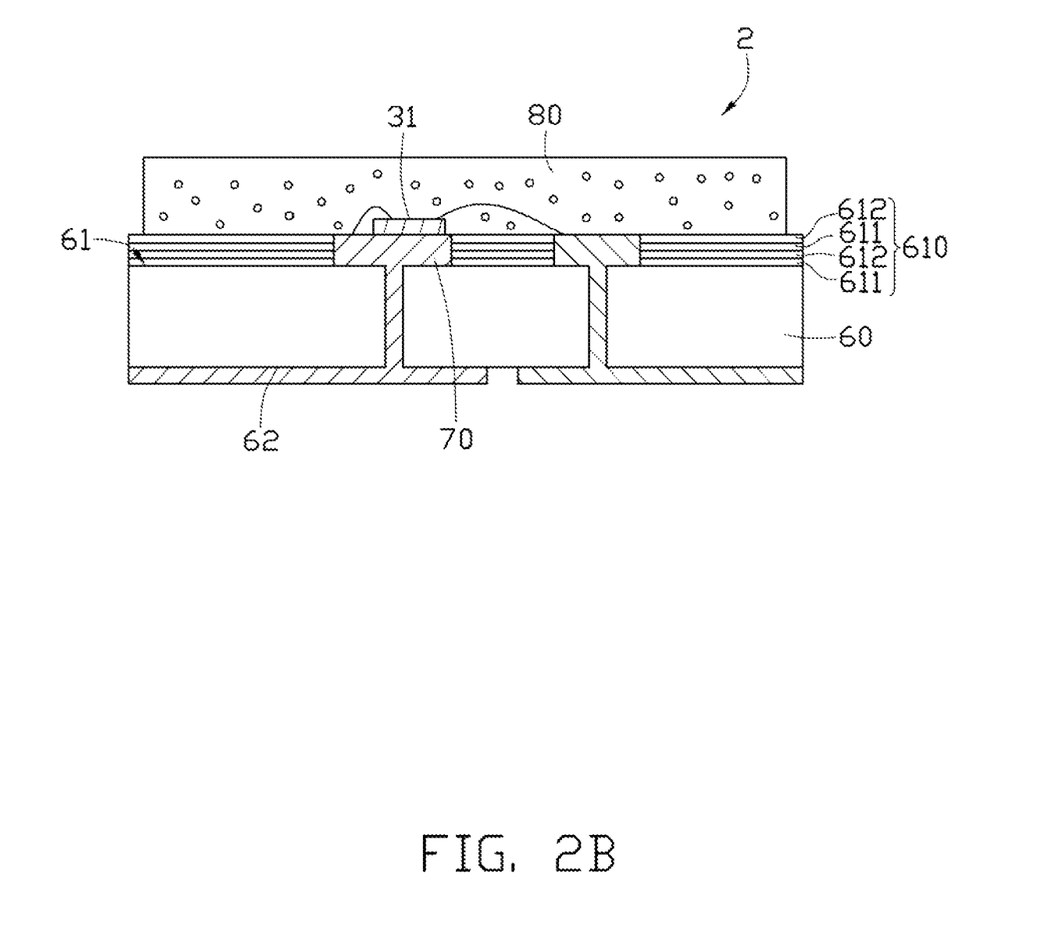
FIG. 2B is a cross section of the light emitting diode package of FIG. 2A.

Referring to FIGS. 2A and 2B, the disclosure provides a second embodiment of a light emitting diode package 2, comprising a substrate 60, a lead frame 70, a light emitting device 31 and an encapsulation 80. The substrate 60 comprises a first surface 61 and a second surface 62 opposite to each other, differing from the first embodiment only in that first surface 61 is a flat plane with a multi-layer structure 610. Accordingly, the light emitting diode package 2 of the second embodiment has a wider light field than the light emitting diode package 1 of the first embodiment. The multi-layer structure 610 is composed of a plurality of first films 611 and a plurality of second films 612 alternately stacked together, wherein the refractive indices of the first film 611 and the second film 612 are different. In the disclosure, the thickness of each of the first and second films 611, 612 is multiple of about a quarter of the wavelength of light emitted from the light emitting device 31. Specifically, the multi-layer structure 610 is a distributed Bragg reflector. Alternatively, the encapsulation 80 can comprise at least one luminescent conversion element 81 such as YAG, TAG, silicate, nitride, nitrogen oxides, phosphide and sulfide.

Figure 3A:
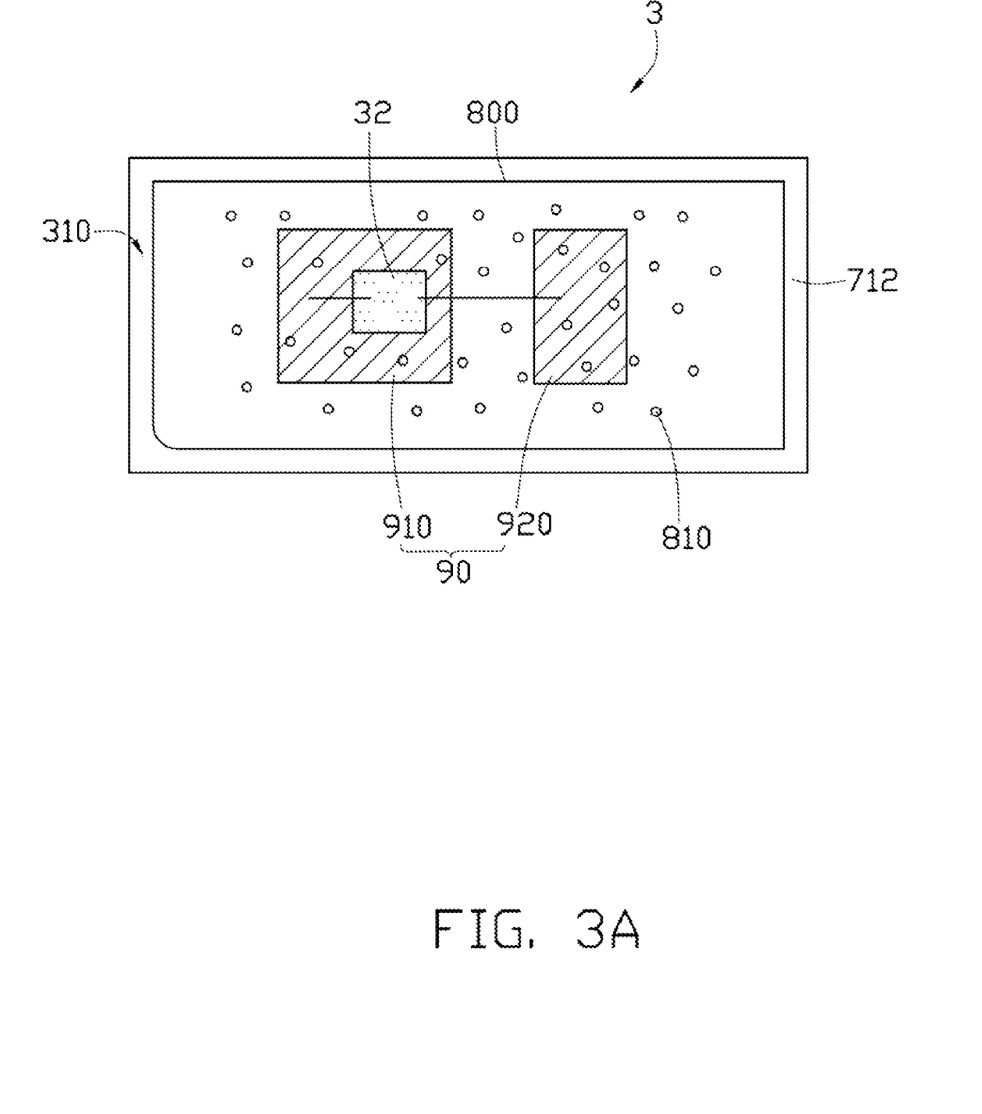
FIG. 3A is a top view of a light emitting diode package in accordance with a third embodiment of the disclosure.
Figure 3B:
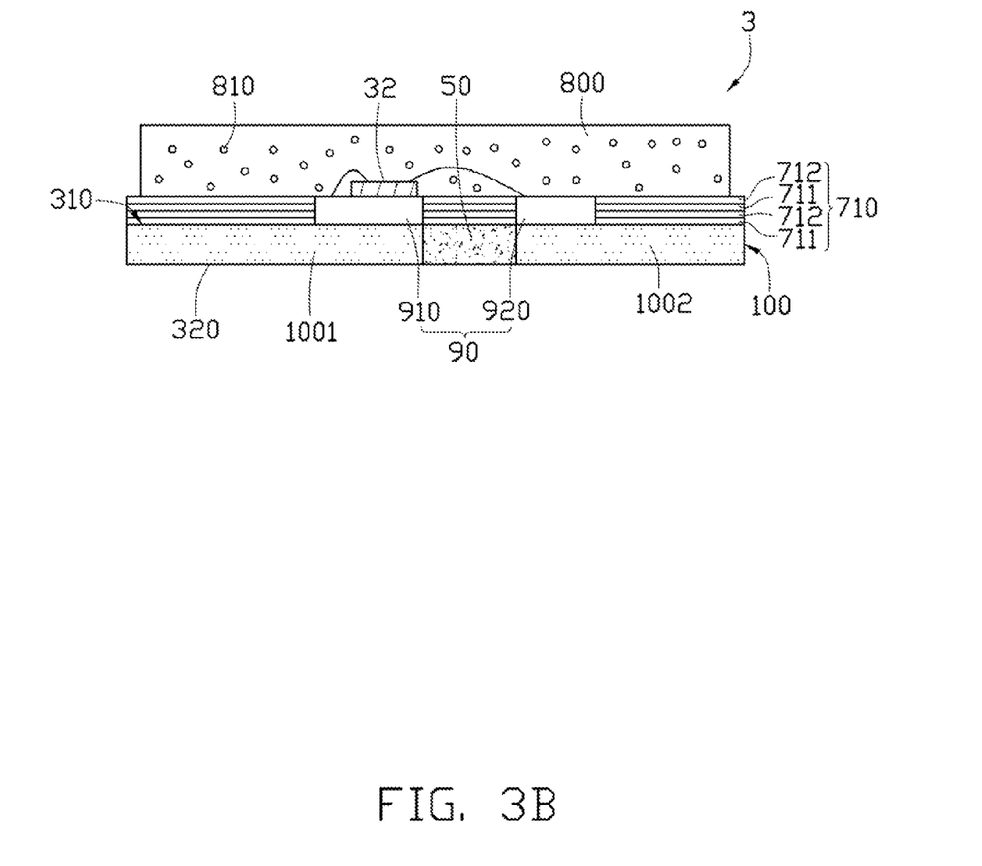
FIG. 3B is a cross section of the light emitting diode package of FIG. 3A.

Referring to FIGS. 3A and 3B, the disclosure provides a third embodiment of a light emitting diode package 3, comprising a substrate 100, a lead frame 90, a light emitting device 32 and an encapsulation 800. The substrate 100 comprises a first part 1001, a second part 1002 and an insulating part 50 sandwiched between the first part 1001 and the second part 1002. In the disclosure, the substrate 100 is electrically conductive such as silicon or metal; therefore the insulating part 50 is configured for electrically insulating the first part 1001 from the second part 1002. Additionally, the substrate 100 comprises a first surface 310 and a second surface 320 opposite to each other. To enhance the light reflecting efficiency of the substrate 100, a multi-layer structure 710 is allocated upon the first surface 310, wherein the insulating part 50, a portion of the first part 1001 and a portion of the second part 1002 is sheltered by the multi-layer structure 710. The multi-layer structure 710 is composed of a plurality of first films 711 and a plurality of second films 712 alternately stacked, refractive indices of which are different. In the disclosure, the thickness of each of the first and second films 711, 712 is a multiple of about a quarter of the wavelength of light emitted from the light emitting device 32. Specifically, the multi-layer structure 710 is a distributed Bragg reflector.

The lead frame 90 comprises a first electrode 910 allocated upon the first part 1001 and a second electrode 920 allocated upon the second part 1002, wherein the first electrode 910 and the second electrode 920 electrically disconnect from each other. Accordingly, electricity from an external circuit (not shown) is able to be conducted into the light emitting device 32 through the substrate 100 and the lead frame 90. Specifically, the lead frame 90 is indium tin oxide (ITO), copper, nickel, silver, aluminum, tin, gold or alloy, formed by plating process, sputtering, evaporation deposition or electronic beam. The light emitting device 32 is electrically connected to the first and second electrodes 910, 920 by wires.

In the disclosure, the encapsulation 800 comprises at least one luminescent conversion element 810 selected from YAG, TAG, silicate, nitride, nitrogen oxides, phosphide and sulfide.

Figure 4:
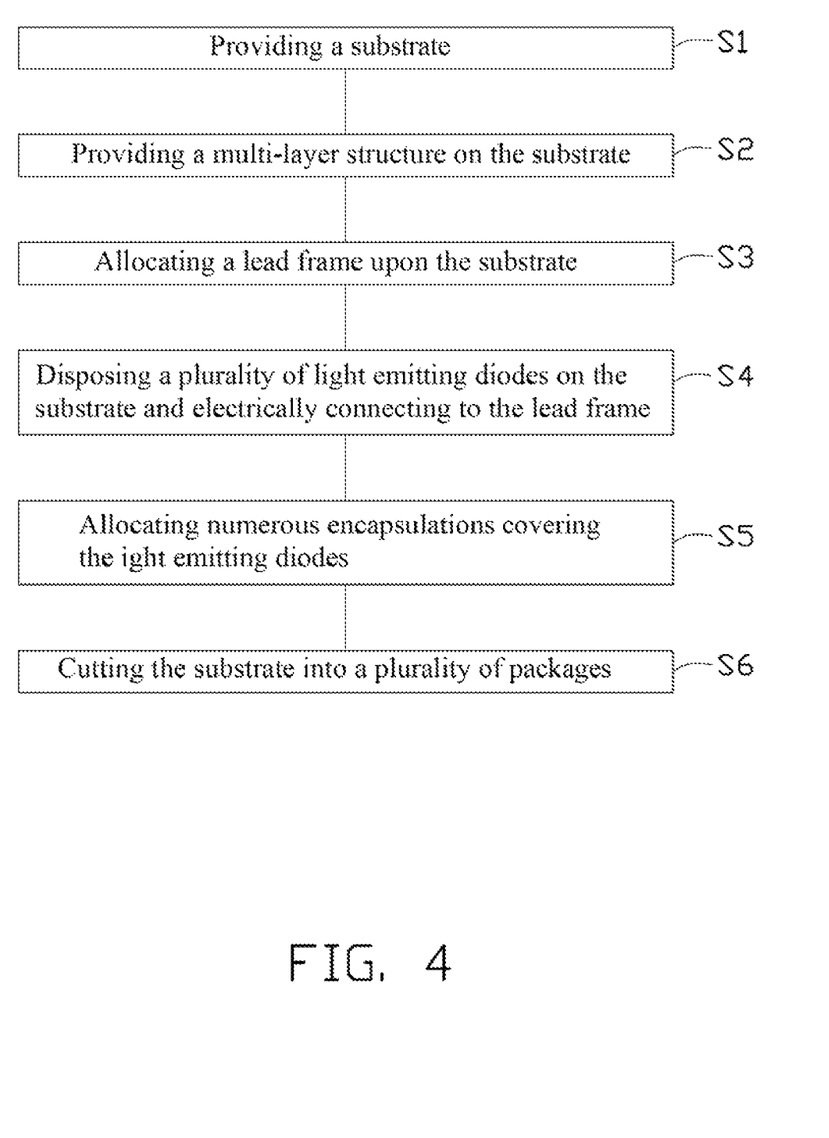
FIG. 4 is a schematic diagram in accordance with a method for manufacturing a light emitting diode package of the disclosure.

As shown in FIG. 4, a method for manufacturing a light emitting diode package of the disclosure as follows.

In step S1, a substrate is provided, wherein the substrate comprises a first surface and a second surface opposite to each other. In the disclosure, the substrate is silicon with high or low resistance. More specifically, the high resistance silicon is composed of phosphorus or boron, whose electrical resistivity is about 1 to 30000 $\Omega$/cm (ohm-centimeter). Further, the low resistance silicon is composed of phosphorus, arsenic, antimony or boron, whose electrical resistivity is about 0.001 to 0.02 $\Omega$/cm.

In step S2, a multi-layer structure is formed on the first surface. The multi-layer structure is composed a plurality of first films and a plurality of second films alternately stacked, refractive indices of which are different. In the disclosure, the first and the second films are respectively silicon oxide and titanium oxide which have similar homogeneity property. Moreover silicon oxide or titanium oxide can be directly formed on the substrate by oxidation or nitriding process without extra processing. When the substrate is low resistance silicon and the film which directly contacts to the substrate is electrically conductive, such as ITO or zinc oxide doped with aluminum, an insulating layer (not shown) is necessarily allocated between the substrate and the film for preventing the electric interference between the film and the substrate. Specifically, the insulating layer is silicon oxide or silicon nitride.

In step S3, a lead frame is formed on the substrate, wherein the lead frame extends from the first surface to the second surface. The lead frame is nickel, silver, aluminum, tin, gold or alloy, formed by plating process, sputtering, evaporation deposition or electronic beam.

In step S4, a plurality of light emitting devices is disposed on the substrate and electrically connecting to the lead frame. Alternatively, the plurality of light emitting devices electrically connects to the lead frame by wire bonding, flip chip or eutectic.

In step S5, a plurality of encapsulations is formed on the substrate and covers the plurality of the light emitting devices. In the disclosure, the encapsulation is formed by injection molding or transfer molding. Alternatively, the encapsulation comprises at least one luminescent conversion element selected from YAG, TAG, silicate, nitride, nitrogen oxides, phosphide and sulfide.

In step S6, the substrate is cut into numerous light emitting diode packages, wherein each package comprises at least one light emitting device. In the disclosure, a mechanical cutter or laser is used to cut the substrate.

Accordingly, the multi-layer structure is formed on the surface of the substrate, thereby the reflectivity of the substrate and the light emitting efficiency of the light emitting diode package are enhanced. Moreover, manufacturing method for the multi-layer structure is simple enough that no elaborate processing is required.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A light emitting diode package, comprising:
    a substrate, comprising a first surface and a second surface opposite to each other, wherein the first surface comprises a multi-layer structure having at least two films with different refractive indices alternately stacked together;
    a lead frame, allocated upon the first surface, wherein the lead frame comprises a first electrode and a second electrode electrically disconnecting from each other;
    a light emitting device, capable of emitting light with one first wavelength, disposed on the lead frame and separately electrically connecting to the first electrode and the second electrode; and
    an encapsulation, allocated upon the first surface and covering the light emitting device and the lead frame;
    wherein the multi-layer structure is located between the encapsulation and the substrate.

2. The light emitting diode package as claimed in claim 1, wherein the lead frame further comprises a thermal-conductive unit allocated between the first electrode and the second electrode, and the light emitting device is disposed on the thermal-conductive unit.

3. The light emitting diode package as claimed in claim 1, wherein the first electrode and the second electrode respectively extends from the first surface to the second surface.

4. The light emitting diode package as claimed in claim 3, wherein the substrate comprises a number of holes through the first surface to the second surface, and the first electrode and the second electrode extend from the first surface to the second surface via the number of holes.

5. The light emitting diode package as claimed in claim 1, wherein the first surface comprises a depression and the light emitting device is disposed inside the depression.

6. The light emitting diode package as claimed in claim 1, wherein the multi-layer structure is a distributed Bragg reflector.

7. The light emitting diode package as claimed in claim 1, wherein each film has a thickness of a multiple of quarter of the first wavelength.

8. The light emitting diode package as claimed in claim 1, wherein each of the at least two films is made of a material selected from the group consisting of silicon oxide, silicon nitride, titanium oxide, indium tin oxide (ITO), aluminum zinc oxide or aluminum oxide.

9. The light emitting diode package as claimed in claim 1, wherein the substrate is silicon, metal, ceramic or polymer.

10. The light emitting diode package as claimed in claim 9, wherein the substrate is electrically conductive.

11. The light emitting diode package as claimed in claim 10, wherein the substrate comprises a first part, a second part and an insulating part sandwiched between the first part and the second part.

12. The light emitting diode package as claimed in claim 1, wherein the encapsulation further comprises at least one luminescent conversion element selected from silicate, nitride, nitrogen oxides, phosphide and sulfide.

13. The light emitting diode package as claimed in claim 1, wherein the multi-layer structure surrounds the first electrode and the second electrode and separates the first electrode from the second electrode, the multi-layer structure having a thickness equal to that of the first electrode and equal to that of the second electrode, a top face of the multi-layer structure being coplanar with top faces of the first electrode and the second electrode.

* * * * *